(12) United States Patent
Nakamura (10) Patent No.: US 9,076,904 B2
(45) Date of Patent: Jul. 7, 2015

(54) PHOTO DETECTOR DEVICE, PHOTO SENSOR AND SPECTRUM SENSOR (71) Applicant: Seiko Epson Corporation, Shinjuku-ku (JP)

(72) Inventor: Noriyuki Nakamura, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/323,987

(22) Filed: Jul. 3, 2014

(65) Prior Publication Data

US 2014/0367819 A1 Dec. 18, 2014

Related U.S. Application Data (60) Continuation of application No. 13/961,771, filed on Aug. 7, 2013, now Pat. No. 8,803,209, which is a division of application No. 13/073,932, filed on Mar. 28, 2011, now Pat. No. 8,564,032.

(30) Foreign Application Priority Data

Mar. 29, 2010 (JP) ................................. 2010-075008

(51) Int. Cl.
*H01L 31/062* (2012.01)
*H01L 21/00* (2006.01)
(Continued)

(52) U.S. Cl.
CPC ...... *H01L 31/02327* (2013.01); *H01L 27/1446* (2013.01); *H01L 27/14623* (2013.01); *H01L 27/14629* (2013.01); *H01L 31/02162* (2013.01); *H01L 31/102* (2013.01); *H01L 31/103* (2013.01)

(58) Field of Classification Search
CPC ............. G01J 3/02; G01J 3/0218; G01J 3/51; G01J 3/0208; G01J 3/513; G01J 3/0229; G01J 3/2803; H01S 5/141; G02B 19/0057
USPC ......... 257/290–294, 431, 432; 438/22, 24, 29
See application file for complete search history.

(56) References Cited

U.S. PATENT DOCUMENTS 6,590,242 B1 7/2003 Kozuka et al.
6,649,951 B2 11/2003 Kozuka et al.
(Continued)

FOREIGN PATENT DOCUMENTS

EP 1 032 049 A2 8/2000
JP 01-217304 A 8/1989
(Continued)

OTHER PUBLICATIONS

Notice of Allowance, dated Apr. 7, 2014, of related U.S. Appl. No. 13/073,932.
(Continued)

*Primary Examiner* — Hsien Ming Lee
(74) *Attorney, Agent, or Firm* — Kilpatrick Townsend & Stockton LLP (57) ABSTRACT A photodetector device includes: a first semiconductor region of a first conductivity type electrically connected to a first external electrode: a second semiconductor region of a second conductivity type formed on the first semiconductor region; a third semiconductor region of the first conductivity type formed on the second semiconductor region; and a plurality of fourth semiconductor regions of the second conductivity type formed on the second semiconductor region, each of the plurality of fourth semiconductor regions being surrounded by the third semiconductor region, including a second conductivity type impurity having a concentration higher than a concentration of the second semiconductor region, and electrically connected to a second external electrode.

8 Claims, 5 Drawing Sheets (51) Int. Cl.
*H01L 31/0232* (2014.01)
*H01L 27/144* (2006.01)
*H01L 31/0216* (2014.01)
*H01L 31/102* (2006.01)
*H01L 31/103* (2006.01)
*H01L 27/146* (2006.01)

(56) References Cited

U.S. PATENT DOCUMENTS

| | | | |
|---|---|---|---|
| 7,235,831 B2 | 6/2007 | Kozuka et al. | |
| 8,077,929 B2 * | 12/2011 | Heidt | 382/115 |
| 8,148,671 B2 * | 4/2012 | Kurahashi | 250/208.1 |
| 2001/0054726 A1 | 12/2001 | Abe | |
| 2004/0057117 A1 | 3/2004 | Hodge et al. | |
| 2004/0061152 A1 | 4/2004 | Kashihura et al. | |
| 2006/0038249 A1 | 2/2006 | Koyama | |
| 2007/0170537 A1 | 7/2007 | Poenar et al. | |
| 2008/0197652 A1 | 8/2008 | Stratten | |
| 2009/0244711 A1 | 10/2009 | Yokoyama et al. | |
| 2009/0294634 A1 | 12/2009 | Kurahashi et al. | |
| 2010/0133596 A1 | 6/2010 | Terakawa | |
| 2010/0149672 A1 | 6/2010 | Lee et al. | |
| 2010/0264297 A1 | 10/2010 | Kurahashi | |
| 2011/0215432 A1 | 9/2011 | Uematsu et al. | |
| 2011/0216315 A1 | 9/2011 | Uematsu et al. | |

FOREIGN PATENT DOCUMENTS

| | | |
|---|---|---|
| JP | 06-129908 A | 5/1994 |
| JP | 09-027606 A | 1/1997 |
| JP | 11-231110 A | 8/1999 |
| JP | 3584196 B2 | 8/2004 |
| JP | 2006-060103 A | 3/2006 |
| JP | 2008-185667 A | 8/2008 |
| JP | 2008-197652 A | 8/2008 |
| JP | 2009-225064 A | 10/2009 |
| JP | 2010-048849 A | 3/2010 |
| JP | 2010-098055 A | 4/2010 |

OTHER PUBLICATIONS

Notice of Allowance, dated Dec. 26, 2013, of related U.S. Appl. No. 13/073,932.
Non-Final Office Action, dated Sep. 12, 2012, of related U.S. Appl. No. 13/073,932.
Notice of Allowance, dated May 10, 2013, of related U.S. Appl. No. 13/073,932.
Notice of Allowance, dated Sep. 19, 2013, of related U.S. Appl. No. 13/073,932.
Non-Final Office Action, dated Aug. 6, 2013, of related U.S. Appl. No. 13/073,923.
Notice of Allowance, dated Apr. 24, 2014, of related U.S. Appl. No. 13/073,923.

* cited by examiner

PHOTO DETECTOR DEVICE, PHOTO SENSOR AND SPECTRUM SENSOR

CROSS REFERENCES TO RELATED APPLICATIONS

This application is a continuation of U.S. patent application Ser. No. 13/961,771, filed Aug. 7, 2013, which is a divisional of U.S. patent application Ser. No. 13/073,932, filed Mar. 28, 2011, now U.S. Pat. No. 8,564,032, which claims priority to Japanese Patent Application No. 2010-075008, filed Mar. 29, 2010, the entire disclosures of which are incorporated by reference herein.

BACKGROUND

1. Technical Field

The invention relates to photodetector devices, photo sensors and spectrum sensors.

2. Related Art

A known photodetector device is composed of a photodiode having a first semiconductor region of a first conductivity type (for example, N type) formed on a substrate, and a second semiconductor region of a second conductivity type (for example, P type) formed on the first semiconductor region.

For example, Japanese patent 3584196 (see claim 1, FIGS. 1, 5 and 11, and Paragraph 0062) (Patent Document) describes a photodetector device having (1) a first semiconductor region of a first conductivity type, (2) a second semiconductor region of a second conductivity type arranged on the first semiconductor region, (3) a third semiconductor region of the first conductivity type arranged on the surface of the second semiconductor region, (4) an electrode region of the second conductivity type that is arranged on the surface of the second semiconductor region and connected to an anode or a cathode, wherein the third semiconductor region is formed in a manner to surround the periphery of the electrode region, and the electrode region has an impurity concentration higher than that of the second semiconductor region. According to the Patent Document, the impurity concentration of the third semiconductor region is made higher than the impurity concentration of the second semiconductor region, whereby the capacitance of the photodetector section is lowered.

However, in the photodetector device described in the Patent Document, because the impurity concentration of the electrode region is made higher than the impurity concentration of the second semiconductor region, and the impurity concentration of the third semiconductor region is made higher than the impurity concentration of the second semiconductor region, the impurity concentration of the second semiconductor region has to be made relatively low. On the other hand, in order for carriers (electrons or holes) generated by the photoelectric effect in the second semiconductor region of the second conductivity type that forms a PN junction with the first semiconductor region of the first conductivity type to move into the electrode region of the second conductivity type, the carriers need to move within the second semiconductor region of the second conductivity type. When the impurity concentration of the second semiconductor region is lowered, as described in the Patent Document, the electrical resistance of the second semiconductor region becomes higher.

SUMMARY

An aspect of the invention pertains to a technology for effectively moving carriers (electrons or holes) generated in the second semiconductor region to a semiconductor region with high impurity concentration connected to an external electrode.

In accordance with an embodiment of the invention, a photodetector device includes a first semiconductor region of a first conductivity type electrically connected to a first external electrode, a second semiconductor region of a second conductivity type formed on the first semiconductor region, a third semiconductor region of the first conductivity type formed on the second semiconductor region, and a plurality of fourth semiconductor regions of the second conductivity type formed on the second semiconductor region, each of the plurality of fourth semiconductor regions being surrounded by the third semiconductor region, each of the plurality of fourth semiconductor regions including a second conductivity type impurity having a concentration higher than that of the second semiconductor region, and electrically connected to a second external electrode. According to the embodiment set forth above, the fourth semiconductor regions connected to the second external electrode are formed in plurality on the second semiconductor region, such that carriers in the second semiconductor region only need to migrate in a small distance, and thus the carriers can be effectively moved to the fourth semiconductor region.

In accordance with an aspect of the embodiment described above, the third semiconductor region may preferably be electrically connected to a third external electrode. Accordingly, by applying a predetermined voltage to the third semiconductor region, a sufficient depletion layer can be formed in the second semiconductor region formed below the third semiconductor region.

In accordance with an another embodiment of the invention, a photodetector device includes a first semiconductor region of a first conductivity type electrically connected to a first external electrode, a second semiconductor region of a second conductivity type formed on the first semiconductor region, a third semiconductor region of the second conductivity type formed on the second semiconductor region, including a second conductivity type impurity having a higher concentration than that of the second semiconductor region, and electrically connected to a second external electrode, and a plurality of fourth semiconductor regions of the first conductivity type formed on the second semiconductor region, each of the plurality of fourth semiconductor regions being surrounded by the third semiconductor region. According to the embodiment set forth above, the third semiconductor region connected to the second external electrode is formed on the second semiconductor region and surrounds the forth semiconductor region, such that carriers in the second semiconductor region need to migrate only in a small distance, and thus the carriers can be effectively moved with respect to the third semiconductor region.

In accordance with an aspect of the embodiment described above, each of the plurality of fourth semiconductor regions may preferably be electrically connected to the third external electrode. According to this composition, by applying a predetermined voltage to the plurality of fourth semiconductor regions, a sufficient depletion layer can be formed in the second semiconductor region formed below the fourth semiconductor regions.

In accordance with an aspect of the embodiment described above, the third external electrode may preferably be a common electrode shared by the first external electrode. Accordingly, the first external electrode connected to the first semiconductor region and the third external electrode connected to the third semiconductor region or the fourth semiconductor region can be commonized, such that the circuit structure can be simplified.

In accordance with still another embodiment of the invention, a photosensor includes the photodetector device described above, and an angle restriction filter that restricts an incident angle of light passing therein toward the photodetector device. In an aspect, at least one portion of the angle restriction filter is formed from a conductive material, and each of the plurality of fourth semiconductor regions of the photodetector device is connected to the second external electrode through the one portion of the angle restriction filter. According to this embodiment, electrical connection between the fourth semiconductor region surrounded by the third semiconductor region and the second external electrode is made by the angle restriction filter, such that additional components for wiring are not necessary, and therefore a reduction in the amount of receiving light by wirings can be suppressed.

In accordance with yet another embodiment of the invention, a photosensor includes the photodetector device described above, and an angle restriction filter that restricts an incident angle of light passing therein toward the photodetector device. In an aspect, at least one portion of the angle restriction filter is formed from a conductive material, and each of the plurality of fourth semiconductor regions of the photodetector device is connected to the third external electrode through the one portion of the angle restriction filter. According to this embodiment, electrical connection between the fourth semiconductor region surrounded by the third semiconductor region and the third external electrode are made by the angle restriction filter, such that additional components for wiring are not necessary, and therefore a reduction in the amount of receiving light by wirings can be suppressed.

In accordance with a further embodiment of the invention, a photosensor includes the photodetector device described above, an angle restriction filter that restricts an incident angle of light passing therein toward the photodetector device, and a wavelength restriction filter that restricts wavelengths of light that can pass through the angle restriction filter. According to this embodiment, the photodetector device described above is used, such that carriers in the second semiconductor region have to move only in a short distance, and therefore the carriers can be effectively moved.

DESCRIPTION OF EXEMPLARY EMBODIMENTS

Preferred embodiments of the invention are described in detail below. It is noted, however, that the embodiments described below do not unduly limit the contents of the invention set forth in the scope of patent claims. Also, not all of the compositions described in the embodiments would necessarily be essential for the solution provided by the invention. Furthermore, the same components will be appended with the same reference numbers, and their description will not be repeated.

1. First Embodiment

Figure 1:
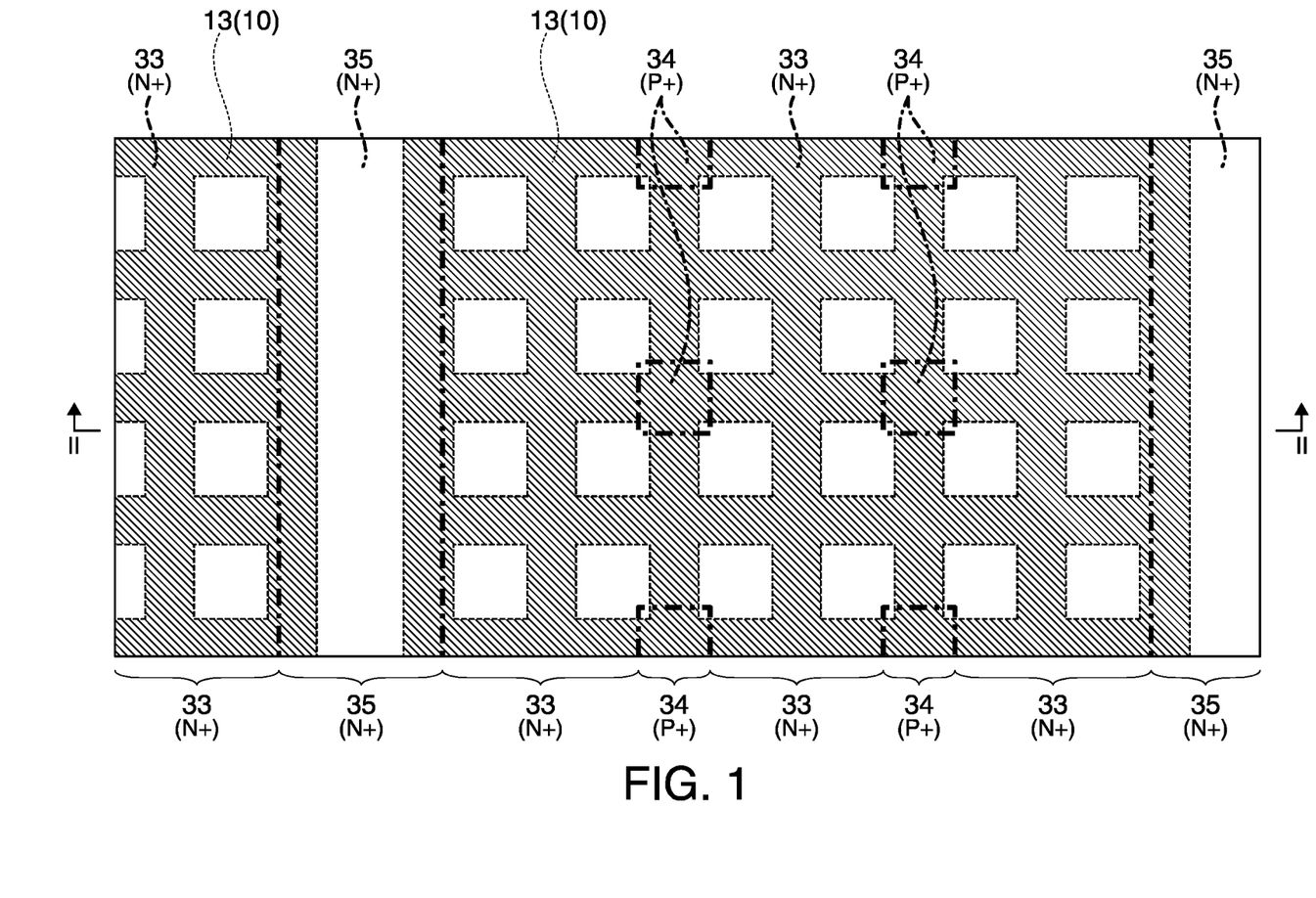
FIG. 1 is a see-through plan view of a photodetector device and a spectrum sensor in accordance with a first embodiment of the invention.
Figure 2:
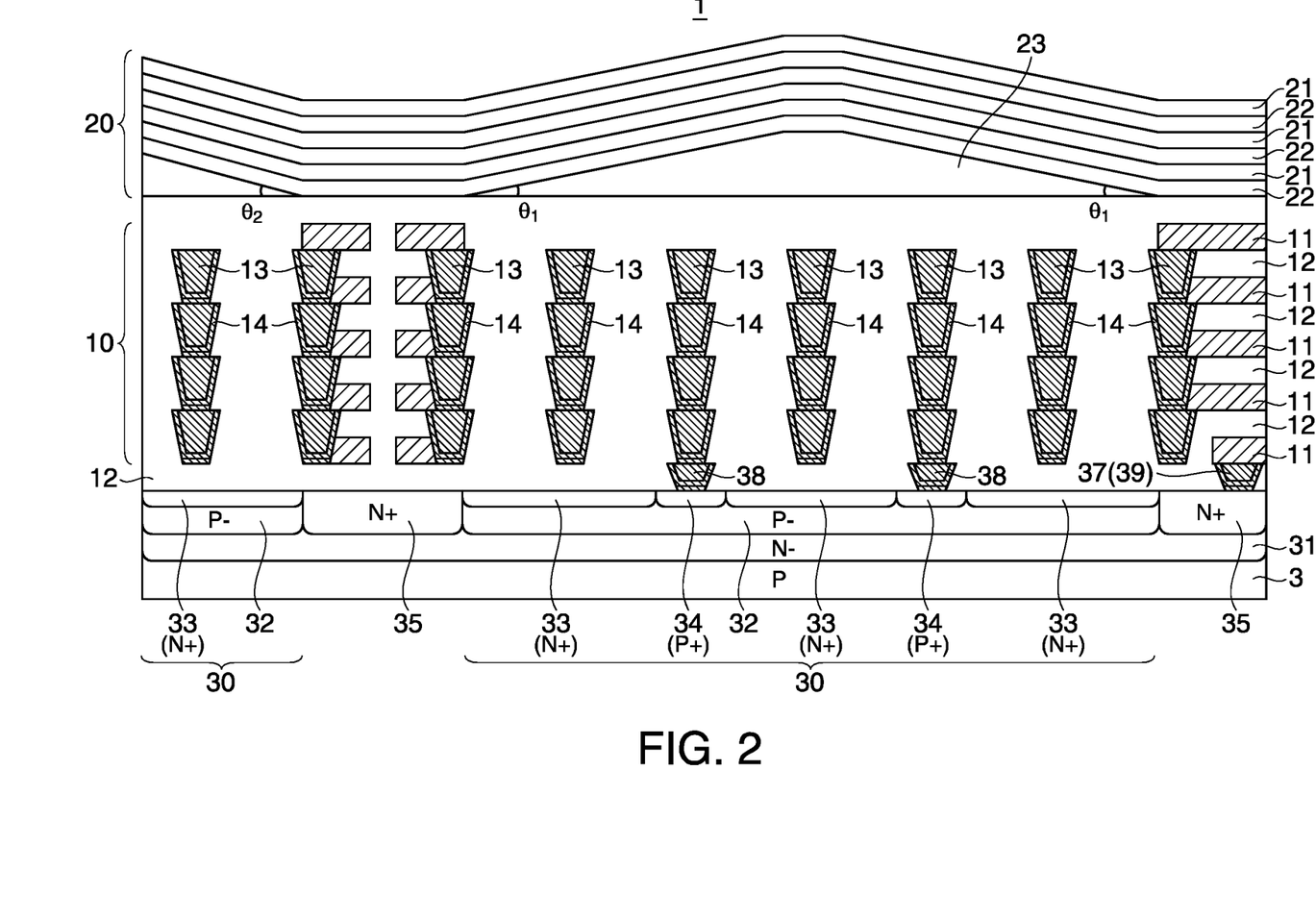
FIG. 2 is a cross-sectional view taken along lines II-II of FIG. 1.

FIG. 1 is a see-through plan view of a photodetector device and a spectrum sensor 1 in accordance with a first embodiment of the invention, and FIG. 2 is a cross-sectional view taken along lines II-II of FIG. 1. The spectrum sensor 1 includes an angle restriction filter 10, a wavelength restriction filter 20, and a photodetector device 30 (see FIG. 2). In FIG. 1, illustration of the wavelength restriction filter 20 is omitted.

In a silicon substrate 3 that serves as a semiconductor substrate where the spectrum sensor 1 is formed, an unshown electronic circuit is formed for applying a predetermined reverse bias voltage to the photodetector device 30, detecting a current based on photovoltaic power generated at the photodetector device 30, amplifying an analog signal according to the magnitude of the current, converting the analog signal to a digital signal and the like. A plurality of aluminum (Al) alloy layers for wiring (not shown) are connected to semiconductor elements composing the electronic circuit, thereby providing electrical connections among the semiconductor elements composing the electronic circuit, and electrical connections between the electronic circuit and external components.

Conductive plugs (not shown) are connected between the plurality of aluminum alloy layers. The conductive plugs electrically connect adjacent upper and lower ones of the aluminum alloy layers at places where the conductive plugs are provided.

1-1. Angle Restriction Filter

As shown in FIG. 2, the angle restriction filter 10 is formed on the silicon substrate 3 in which the photodetector device 30 is formed. In the angle restriction filter 10 of the present embodiment, light shield members 13 composed of conductive plugs that are formed by the same process used for the conductive plugs on the above-described electronic circuit, thereby forming optical path wall sections. The light shield members 13 are formed from tungsten (W).

Further, the silicon substrate 3 is provided thereon with a plurality of aluminum alloy layers 11 formed by the same multilayer wiring process used for the aluminum alloy layers on the electronic circuit described above, which are laminated through silicon oxide ($SiO_2$) layers 12 serving as insulation layers each having light transmissivity (in other words, light transmissivity to light having wavelengths to be received by the photodetector device 30). The embodiment is not limited to the aluminum alloy layers, and the layers 11 may be composed of copper (Cu) alloy layers.

The light shield members 13 are composed of material that does not substantially transmit light with wavelengths to be received by the photodetector device 30, and may be continuously formed in a plurality of layers (see FIG. 2) in a predetermined pattern, for example, a lattice configuration (see FIG. 1) on the silicon substrate 3, such that an optical path in the lamination direction of the light shield members 13 is formed.

The incident angle of light passing through the optical path is restricted by the optical path wall sections formed with the light shield members 13. More specifically, when light incident upon the optical path is angled more than a predetermined restriction angle with respect to the direction of the optical path, the light hits the light shield members 13, whereby a portion of the light is absorbed by the light shield members 13, and the remaining portion is reflected. The reflection is repeated until the light passes the optical path, whereby the reflected light becomes weaker. Therefore, light that can pass the angle restriction filter 10 is restricted to those light having incident angles with respect to the optical path being less than the predetermined restriction angle.

Areas surrounded by the light shield members 13 are composed of the above-described silicon oxide layer 12 having light transmissivity, and thus function as light transmission sections that transmit incident light.

In the embodiment described above, the light shield members 13 are formed in multiple layers in a predetermined lattice pattern on the silicon substrate 3, thereby forming the optical path wall sections. Therefore, very fine patterns can be formed, and the restriction filters 10 can be manufactured in a small size. Further, compared to a spectrum sensor that is formed by laminating members, the manufacturing process can be simplified, and a reduction in transmission light by adhesive can be suppressed.

In accordance with a preferred embodiment, the light shield members 13 are formed from the same material (tungsten, or the like) as that of the conduction plugs described above. By this, the angle restriction filter 10 can be formed by the semiconductor process at the same time when the aluminum alloy layers for wirings for the electronic circuits and the conductive plugs are formed on the same silicon substrate 3.

Further, in accordance with a preferred embodiment, a titanium nitride (TiN) film 14 that serves as an adhesive layer between tungsten and silicon oxide is formed on the surface of each of the light shield members 13.

Also, in accordance with a preferred embodiment, the light shield members 13 are electrically connected to the aluminum alloy layers 11 through side surfaces of the aluminum alloy layers 11. As fourth semiconductor regions 34 (to be described below) to be formed on the silicon substrate 3 are electrically connected to the bottom ends of the light shield members 13, electrical connection between the photodiode device 30 and the aluminum alloy layers 11 can be achieved.

1-2. Wavelength Restriction Filter

The wavelength restriction filter 20 is formed on the angle restriction filter 10, and is composed of a plurality of laminated layers of thin films of a low refractive index 21 such as silicon oxide ($SiO_2$) and thin films of a high refractive index 22 such as titanium oxide ($TiO_2$), which are slightly tilted with respect to the silicon substrate 3. The thin films of a low refractive index 21 and the thin films of a high refractive index 22 each having a predetermined film thickness on the order of, for example, submicron, are laminated, for example, in about 60 layers in total, thereby forming, for example, a thickness of about 6 μm on the whole.

Tilt angles $\theta_1$ and $\theta_2$ of the low refractive index thin films 21 and the high refractive index thin films 22 with respect to the silicon substrate 3, may be set at, for example, 0 degree or greater but 30 degrees or smaller, according to set wavelengths of light to be received by the photodetector device 30.

In order to have the low refractive index thin films 21 and the high refractive index thin films 22 tilted with respect to the silicon substrate 3, for example, a tilt structure 23 having transmissivity is formed on the angle restriction filter 10, and the low refractive index thin films 21 and the high refractive index thin films 22 are formed on the tilt structure 23. The tilt structure 23 may be formed by, for example, depositing a silicon oxide layer on the angle restriction filter 10 and processing the silicon oxide layer by a CMP (chemical mechanical polishing) method.

In this manner, by forming in advance the tilt structures 23 having the tilt angles $\theta_1$ and $\theta_2$ that are different depending on the set wavelengths of light to be received by the photodetector device 30, the low refractive index thin films 21 and the high refractive index thin films 22 can be formed each in the same thickness by a common process, without regard to the set wavelengths of light to be received by the photodetector device 30.

The wavelength restriction filter 20 having such a structure described above restricts wavelengths of light (light that can pass through the angle restriction filter 10) incident on the angle restriction filter 10 within the predetermined range of restricting angles. More specifically, a portion of incident light that has entered the wavelength restriction filter 20 becomes reflected light and another portion thereof becomes transmitting light at an interface between a set of the low refractive index thin film 21 and the high refractive index thin film 22. Then, a portion of the reflected light reflects again at an interface between another set of the low refractive index thin film 21 and the high refractive index thin film 22 and the aforementioned transmitting light are coupled together. In this instance, when light has a wavelength that matches with the optical path length of reflected light, the reflected light and the transmitting light match in phase with each other, and thus strengthen each other. When light has a wavelength that does not match with the optical path length of reflected light, the reflected light and the transmitting light do not match in phase with each other, and thus weaken each other (destructively interfere with each other).

The optical path length of reflected light is determined by the tilt angles of the low refractive index thin film 21 and the high refractive index thin film 22 with respect to the direction of the incident light. Accordingly, when the interference action described above is repeated in the low refractive index thin films 21 and the high refractive index thin films 22, which amount to the total of sixty layers, light having only specific wavelengths can pass the wavelength restriction filter 20, according to the incident angle of incident light, and are emitted from the wavelength filter 20 at a predetermined emission angle (for example, at the same angle as the incident angle to the wavelength restriction filter 20).

The angle restriction filter 10 allows only light incident on the angle restriction filter 10 in the predetermined range of restriction angles to pass therein. Accordingly, the wavelengths of light that passes through the wavelength restriction filter 20 and the angle restriction filter 10 are restricted to a predetermined range of wavelengths which is determined by the tilt angles $\theta_1$ and $\theta_2$ of the low refractive index thin films 21 and the high refractive index thin films 22 with respect to the silicon substrate 3, and the range of restriction angles of incident light the angle restriction filter 10 allows to pass.

1-3. Photodetector Device

The photodetector device 30 is an element that receives light that has passed through the wavelength restriction filter 20 and the angle restriction filter 10, and converts the light to photovoltaic power. FIG. 2 shows the photodetector device 30 that receives light with wavelengths that are determined by the tilt angle $\theta_1$ of the wavelength restriction filter 20, and a portion of the photodetector device 30 that receives light with wavelengths that are determined by the tilt angle $\theta_2$ of the wavelength restriction filter 20.

The photodetector device 30 includes various kinds of semiconductor regions that are formed in the silicon substrate 3 by ion implantation or the like. In accordance with the present embodiment, the semiconductor regions formed in the silicon substrate 3 include: (1) a first semiconductor region 31 of a first conductivity type electrically connected to a first external electrode; (2) a second semiconductor region 32 of a second conductivity type formed on the first semiconductor region 31; (3) a third semiconductor region (a pinning layer) 33 of the first conductivity type formed on the second semiconductor region 32; (4) a plurality of fourth semiconductor regions 34 of the second conductivity type formed on the second semiconductor region 32, each of the plurality of fourth semiconductor regions 34 being surrounded by the third semiconductor region 33, each of the plurality of fourth semiconductor regions 34 including a second conductivity type impurity having a higher concentration than that of the second semiconductor region 32, and electrically connected to a second external electrode.

In this embodiment, the first conductivity type is, for example, N type, and the second conductivity type and the conductivity type of the silicon substrate 3 are, for example, P type. In this case, the first external electrode is a cathode electrode, and the second external electrode is an anode electrode.

The first semiconductor region 31 is connected to a connection section 37 to the first external electrode through a fifth semiconductor region 35 of the first conductivity type. On the other hand, the second semiconductor region 32 is connected to connection sections 38 to the second external electrode through the plurality of fourth semiconductor regions 34. Therefore, a reverse bias voltage can be applied to the PN junction formed between the first semiconductor region 31 and the second semiconductor region 32 through the first external electrode and the second external electrode.

As light that has passed through the angle restriction filter 10 is received by the photodetector device 30, photovoltaic power is generated at the PN junction formed between the first semiconductor region 31 and the second semiconductor region 32, whereby an electrical current is generated. By detecting the electrical current by the above-described electronic circuit connected to the first external electrode or the second external electrode, the light received by the photodetector device 30 can be detected.

In the first embodiment, the fourth semiconductor region 34 of the second conductivity type is formed, surrounded by the third semiconductor regions (pinning layer) 33 of the first conductivity type (see FIG. 1), such that a large area for the third semiconductor regions 33 can be secured on the second semiconductor region 32. Accordingly, generation of thermally excited carriers at the interface between the silicon substrate 3 and the silicon oxide layer 12 and generation of dark current noise caused by the thermally excited carriers can be suppressed.

Moreover, in accordance with the first embodiment, as the fourth semiconductor regions 34 each connected to the second external electrode and surrounded by the third semiconductor region 33 are formed in plurality (see FIG. 1), the distance in which carriers generated in the second semiconductor region 32 that is located below the third semiconductor region 33 moves to the fourth semiconductor region 34 can be shortened, such that the carriers are effectively moved.

Also, in accordance with the first embodiment, the third semiconductor region 33 is connected to the connection section 39 connecting to the third external electrode through the fifth semiconductor region 35. In the present embodiment, as shown in FIG. 2, the connection section 37 to the first external electrode and the connection section 39 to the third external electrode are commonized, such that the first external electrode and the third external electrode are a commonly shared electrode. By this structure, a voltage equivalent to the above-described reverse bias voltage applied to the first external electrode can be applied to the third semiconductor region 33, such that a sufficient depletion layer can be formed in the second semiconductor region 32. In this exemplary embodiment, the first semiconductor region 31 and the third semiconductor region 33 are connected at the fifth semiconductor region 35. However, without any particular limitation to the above, the first semiconductor region 31 may be connected to the first external electrode by a conductive layer (not shown) that is not connected to the third semiconductor region 33, and the first external electrode and the third external electrode may be set at different potentials in the same polarity.

Also, in the embodiment described above, the angle restriction filter 10 is formed from a conductive material. Further, the plural fourth semiconductor regions 34 are connected to the connection sections 38 that are located at the lower ends of the angle restriction filters 10, respectively, and are connected to the second external electrode through the angle restriction filters 10. Accordingly, it is not necessary to provide conductive members for wiring other than the angle restriction filter 10 on the photodetector device 30, and therefore a reduction in the amount of receiving light by such wirings can be avoided.

1-4. Manufacturing Method in Accordance with First Embodiment

Here, a method for manufacturing the spectrum sensor 1 in accordance with the first embodiment will be briefly described. The spectrum sensor 1 is manufactured through initially forming the photodetector device 30 on the silicon substrate 3, then forming the angle restriction filter 10 on the photodetector device 30, and then forming the wavelength restriction filter 20 on the angle restriction filter 10.

Initially, the photodetector device 30 is formed on the silicon substrate 3. FIGS. 3A-3E are views showing a process of forming the photodetector device 30.

Figure 3A:
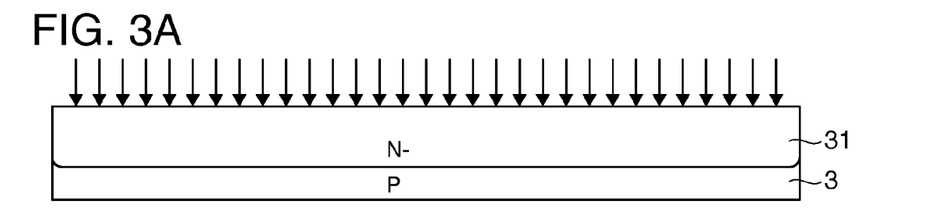
FIGS. 3A-3E are views showing steps of forming the photodetector device.

(1) First, a patterned resist (not shown) is formed, and a first semiconductor region 31 of N type is formed in the P type silicon substrate 3 by ion injection or the like, using the resist as a mask, as shown in FIG. 3A. The ions to be injected may be, for example, phosphor ($P^+$), the ion injection energy may be, for example, 1 MeV-3 MeV, and the doping amount may be, for example, $1.0\times10^{12}$ atoms/cm$^2$ $1.0\times10^{14}$ atoms/cm$^2$. After the ion injection, the resist is removed.

Figure 3B:
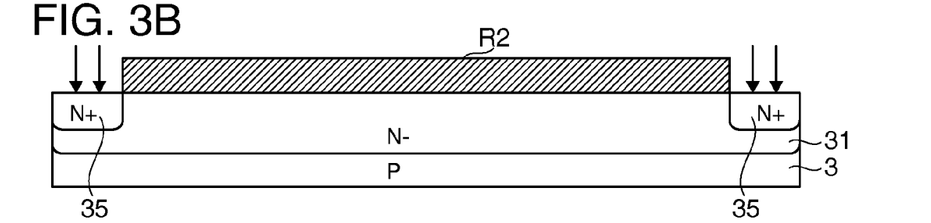

(2) Then, as shown in FIG. 3B, a patterned resist R2 is formed, and a fifth semiconductor region 35 of N type is formed by further injecting ions in the first semiconductor region 31, using the resist R2 as a mask. The ions to be injected may be, for example, phosphor ($P^+$), the ion injection energy may be, for example, 100 KeV-1000 KeV, and the doping amount may be, for example, $1.0\times10^{13}$ atoms/cm$^2$ $1.0\times10^{15}$ atoms/cm$^2$. After the ion injection, the resist R2 is removed.

Figure 3C:
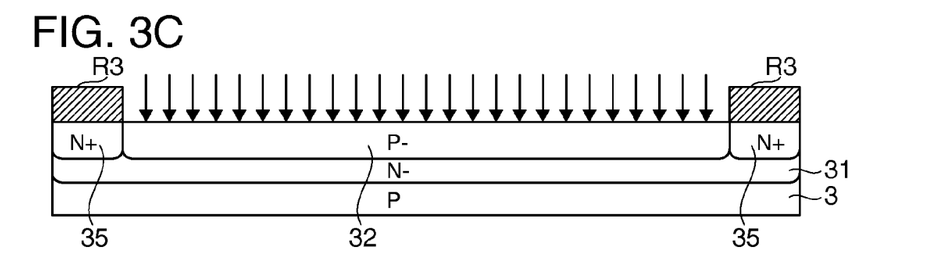

(3) Then, as shown in FIG. 3C, a patterned resist R3 is formed, and a second semiconductor region 32 of P type is formed by further injecting ions in the first semiconductor region 31, using the resist R3 as a mask. The ions to be injected may be, for example, boron ($B^+$), the ion injection energy may be, for example, 50 KeV-300 KeV, and the doping amount may be, for example, $1.0\times10^{11}$ atoms/cm$^2$ $1.0\times10^{13}$ atoms/cm$^2$. After the ion injection, the resist R3 is removed.

Figure 3D:
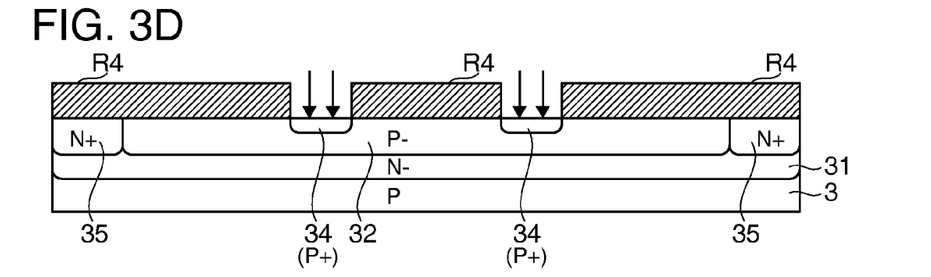

(4) Then, as shown in FIG. 3D, a patterned resist R4 is formed, and a fourth semiconductor region 34 of P type is formed by further injecting ions in the second semiconductor region 32, using the resist R4 as a mask. The ions to be injected may be, for example, boron ($B^+$), the ion injection energy may be, for example, 5 KeV-50 KeV, and the doping amount may be, for example, $1.0\times10^{13}$ atoms/cm$^2$ $1.0\times10^{15}$ atoms/cm$^2$. After the ion injection, the resist R4 is removed.

Figure 3E:
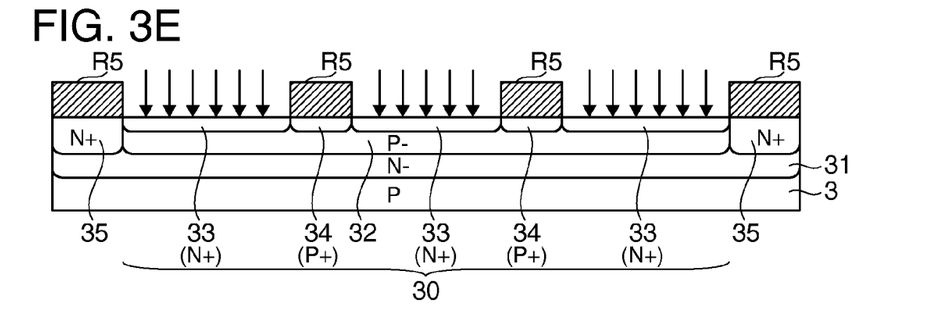

(5) Finally, as shown in FIG. 3E, a patterned resist R5 is formed, and a third semiconductor region 33 of N type is formed by further injecting ions in the second semiconductor region 32, using the resist R5 as a mask. The ions to be injected may be, for example, arsenic (As⁺), the ion injection energy may be, for example, 10 KeV-100 KeV, and the doping amount may be, for example, $1.0 \times 10^{12}$ atoms/cm² $1.0 \times 10^{14}$ atoms/cm². After the ion injection, the resist R5 is removed. The steps (1)-(5) described above may be conducted concurrently with formation of an electronic circuit to be provided on the same silicon substrate 3.

Next, the angle restriction filter 10 is formed on the photodetector device 30 (see FIG. 2). For example, tungsten light shield members 13 may be formed at the same time when forming conductive plugs for connecting aluminum alloy layers for wiring for the above-described electronic circuit. Also, aluminum alloy layers 11 may be formed at the same time when the aluminum alloy layers for wiring for the above-described electronic circuit are formed. Silicon oxide layers 12 may also be formed at the same time when forming dielectric films between the plural aluminum alloy layers for wiring for the above-described electronic circuit. By a combination of the photodetector device 30 and the angle restriction filter 10, an optical sensor that detects incident light within a predetermined restriction angle range (a directional optical sensor) can be obtained.

Next, a wavelength restriction filter 20 is formed on the angle restriction filter 10 (see FIG. 2). For example, first, a silicon oxide layer is formed on the angle restriction filter 10, and the silicon oxide layer is processed into a tilt structure 23 having a predetermined angle by a CMP method or the like. Then, thin films of a lower refractive index 21 and thin films of a higher refractive index 22 are alternately laminated in multiple layers. The spectrum sensor 1 is manufactured through the steps described above.

2. Second Embodiment

Figure 4:
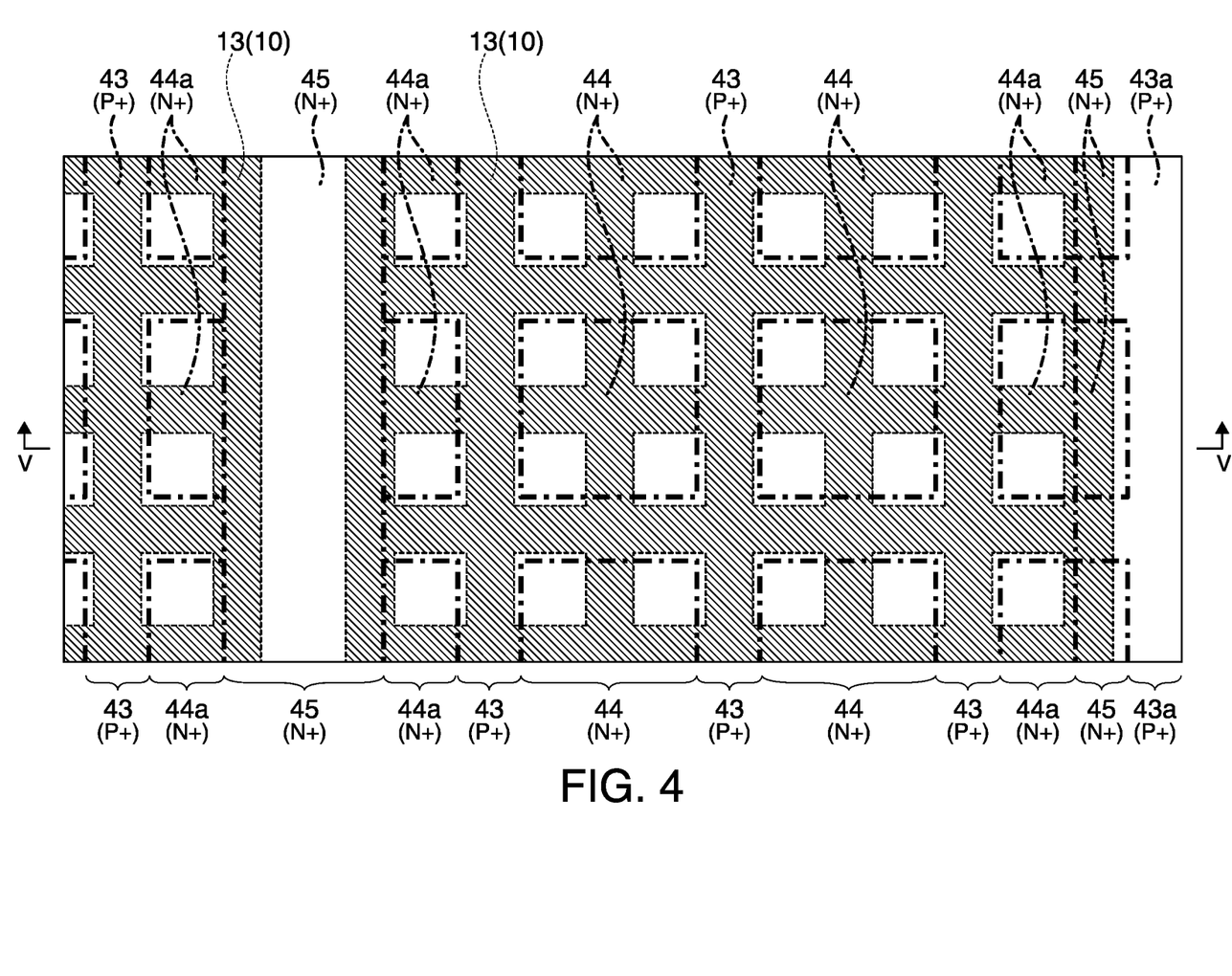
FIG. 4 is see-through plan view of a photodetector device and a spectrum sensor in accordance with a second embodiment of the invention.
Figure 5:
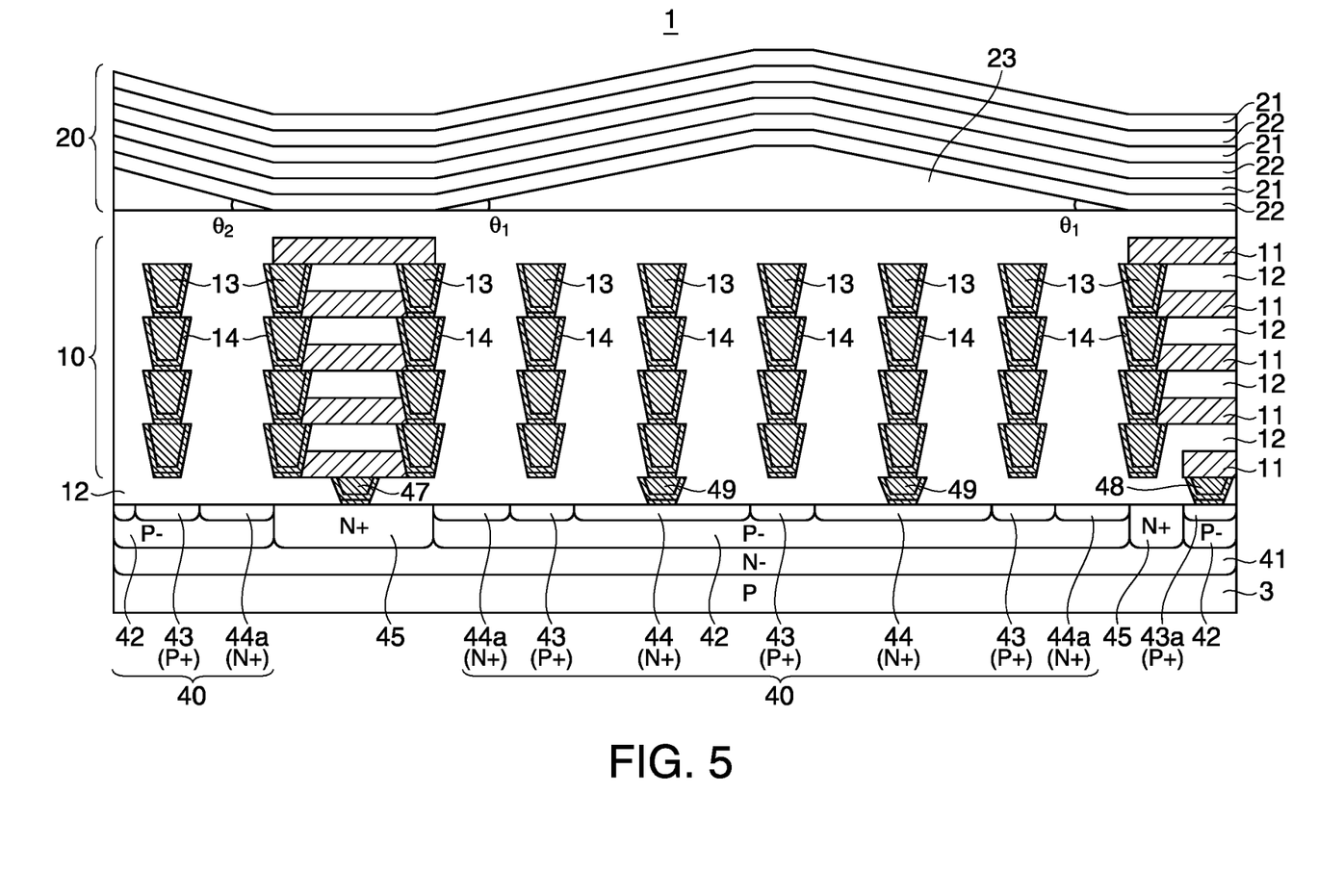
FIG. 5 is a cross-sectional view taken along lines V-V of FIG. 4.

FIG. 4 is a see-through plan view of a photodetector device and a spectrum sensor in accordance with a second embodiment of the invention, and FIG. 5 is a cross-sectional view taken along lines V-V of FIG. 4. The spectrum sensor in accordance with the second embodiment is different from the spectrum sensor in accordance with the first embodiment mainly in terms of its photodetector device 40.

The photodetector device 40 in accordance with the second embodiment has (1) a first semiconductor region 41 of a first conductivity type that is electrically connected to a first external electrode, and (2) a second semiconductor region 42 of a second conductivity type formed on the first semiconductor region 41, which are the same as the first embodiment. The photodetector device 40 in accordance with the second embodiment includes (3) a third semiconductor region 43 of the second conductivity type that includes a second conductivity type impurity higher in concentration than that of the second semiconductor region 42, and is formed on the second semiconductor region 42 and electrically connected to a second external electrode, and (4) a plurality of fourth semiconductor regions (pinning layers) 44 of the first conductivity type each formed on the second semiconductor region 42 and surrounded by the third semiconductor region 43, which are different from the first embodiment.

In other words, in the first embodiment, the fourth semiconductor regions 34 of the second conductivity type are formed in plurality, each surrounded by the third semiconductor region (pinning layer) 33 of the first conductivity type. In contrast, in accordance with the second embodiment, the fourth semiconductor regions (pinning layers) 44 of the first conductivity type are formed in plurality, each surrounded by the third semiconductor region 43 of the second conductivity type.

The first semiconductor region 41 is connected to a connection section 47 that connects to the first external electrode through the fifth semiconductor region 45 of the first conductivity type. On the other hand, the second semiconductor region 42 is connected to a connection section 48 connecting to a second external electrode at a portion 43a outside the light receiving region of the photodetector device 40 through the third semiconductor region 43 (see FIG. 4) formed in a lattice configuration along the light shield members 13 of the angle restriction filter 10. Therefore, a reverse bias voltage can be applied to a PN junction formed between the first semiconductor region 41 and the second semiconductor region 42 through the first external electrode and the second external electrode.

In accordance with the second embodiment, the fourth semiconductor regions (pinning layers) 44 of the first conductivity type are formed in plurality, each being surrounded by the third semiconductor region 43 of the second conductivity type, such that the fourth semiconductor regions 44 can be secured in plurality on the second semiconductor region 42. Accordingly, generation of thermally excited carriers at the interface between the silicon substrate 3 and the silicon oxide layer 12 and generation of dark current noise caused by the thermally excited carriers can be suppressed.

Furthermore, in accordance with the second embodiment, the fourth semiconductor region 44 is surrounded by the third semiconductor region 43 that is connected to the second external electrode (see FIG. 4), such that the distance in which carriers generated in the second semiconductor region 42 located below the fourth semiconductor region 44 move to the third semiconductor region 43 can be shortened, and thus the carriers are effectively moved.

Also, in accordance with the second embodiment, the plurality of the fourth semiconductor regions 44 are each connected to the connection section 49 connecting to the third external electrode. In the present embodiment, as shown in FIG. 5, the connection section 47 to the first external electrode and the connection section 49 to the third external electrode are connected through the angle restriction filter 10, such that the first external electrode and the third external electrode are a commonly shared electrode. By this structure, a voltage equivalent to the above-described reverse bias voltage applied to the first external electrode can be applied to the plurality of the fourth semiconductor regions 44, such that a sufficient depletion layer can be formed in the second semiconductor region 42. It is noted that the pinning layers 44a having the same impurity concentration as that of the fourth semiconductor region 44 are connected to the first external electrode through the fifth semiconductor region 45. In this exemplary embodiment, the first external electrode and the third external electrode are a commonly shared electrode. However, without being limited to the above, the first external electrode and the third external electrode may have different potentials in the same polarity.

In the first embodiment and the second embodiment described above, the first conductivity type is N type, and the second conductivity type and the conductivity type of the silicon substrate 3 are P type. However, without being limited to the above, the first conductivity type may be P type, and the second conductivity type and the conductivity type of the silicon substrate 3 may be N type. In this case, the first external electrode is an anode electrode, and the second external electrode is a cathode electrode.

What is claimed is:

1. A directional photo sensor comprising:
   a photodetector device; and
   an angle restriction filter that transmits light incident thereon in an incident angle range toward the photodetector device;
   wherein the photodetector device includes:
   a first semiconductor region of a first conductivity type; and
   a second semiconductor region of a second conductivity type formed on the first semiconductor region;
   wherein at least one portion of the angle restriction filter is formed from a conductive material and electrically connected to the second semiconductor region.

2. A directional photo sensor according to claim 1, wherein the one portion of the angle restriction filter is directly connected to a silicon substrate in which the photodetector device is formed.

3. A directional photo sensor according to claim 1, wherein the one portion of the angle restriction filter includes optical path wall sections formed with light shield members; wherein the light shield members are formed in a plurality of layers that are laminated together, such that an optical path is formed in the lamination direction of the plurality of layers of the light shield members.

4. A directional photo sensor according to claim 3, wherein the light shield members are formed in a lattice pattern.

5. A directional photo sensor according to claim 3, wherein the light shield members are formed from the same material.

6. A directional photo sensor according to claim 3, wherein the light shield members are formed from tungsten.

7. A directional photo sensor according to claim 3, wherein a titanium nitride film is formed on a surface of each of the light shield members.

8. A spectrum sensor comprising:
   the directional photo sensor according to claim 1; and
   a wavelength restriction filter that restricts wavelengths of light that pass through the angle restriction filter.

* * * * *